United States Patent
Zhang et al.

(10) Patent No.: US 12,369,743 B2
(45) Date of Patent: Jul. 29, 2025

(54) COFFEE MACHINE FOR WIRELESSLY DRIVING COFFEE CUP HOLDER TO ROTATE

(71) Applicant: Shenzhen Buydeem Technology Co., Shenzhen (CN)

(72) Inventors: George Mohan Zhang, Shenzhen (CN); Huajin Chen, Shenzhen (CN)

(73) Assignee: Shenzhen Buydeem Technology Co., Shenzhen (CN)

( * ) Notice: Subject to any disclaimer, the term of this patent is extended or adjusted under 35 U.S.C. 154(b) by 948 days.

(21) Appl. No.: 17/509,084

(22) Filed: Oct. 25, 2021

(65) Prior Publication Data
US 2022/0313009 A1  Oct. 6, 2022

(30) Foreign Application Priority Data
Apr. 2, 2021  (CN) .......................... 202110361019.9

(51) Int. Cl.
*A47J 31/52* (2006.01)
*A47J 31/06* (2006.01)
*A47J 31/36* (2006.01)
*A47J 31/44* (2006.01)
*H10F 30/10* (2025.01)

(52) U.S. Cl.
CPC ......... *A47J 31/525* (2018.08); *A47J 31/0657* (2013.01); *A47J 31/3604* (2013.01); *A47J 31/4407* (2013.01); *A47J 31/441* (2013.01); *H10F 30/10* (2025.01)

(58) Field of Classification Search
CPC ..... H01L 31/09; A47J 31/441; A47J 31/4407; A47J 31/0657; A47J 31/525; A47J 31/3604

USPC ......................................................... 99/280
See application file for complete search history.

(56) References Cited

U.S. PATENT DOCUMENTS

| | | | | |
|---|---|---|---|---|
| 2,459,305 A | * | 1/1949 | Brandl | A47J 31/545 99/305 |
| 2,568,474 A | * | 9/1951 | Van Sciver | A47J 27/21008 137/341 |
| 2,846,938 A | * | 8/1958 | Brandl | A47J 31/0573 99/281 |
| 3,049,987 A | * | 8/1962 | Bampfer | A47J 31/545 99/281 |

(Continued)

FOREIGN PATENT DOCUMENTS

CN    210930893 U  *  7/2020
CN    210930899 U  *  7/2020

*Primary Examiner* — Jimmy Chou
(74) *Attorney, Agent, or Firm* — Ying-Ting Chen

(57) ABSTRACT

A coffee machine for wirelessly driving a coffee cup holder to rotate comprises a machine body and a cup holder; the cup holder comprises a base, a cup holder and a driving motor, wherein the base is internally provided with a driving motor, and the output shaft of the driving motor is sleeved with the cup holder; the upper part of the machine body is provided with a support, the support is provided with a sprinkler head, the sprinkler head is provided above the cup holder, and the height difference between the sprinkler head and the cup holder is capable of accommodating a coffee cup in which a coffee filter cup is placed; the machine body is provided with a charging coil, the cup holder is provided with a power receiving coil, and the installation position of the power receiving coil corresponds to that of the charging coil.

11 Claims, 2 Drawing Sheets

(56) References Cited

U.S. PATENT DOCUMENTS

| | | | | |
|---|---|---|---|---|
| 3,423,209 A * | 1/1969 | Weber | A47J 31/40 | 99/302 R |
| 3,587,444 A * | 6/1971 | Godel | A47J 31/106 | 99/306 |
| 3,619,561 A * | 11/1971 | Smit | H01H 29/20 | 392/467 |
| 3,691,933 A * | 9/1972 | Martin | A47J 31/057 | 99/282 |
| 3,759,161 A * | 9/1973 | Anderson | A47J 31/56 | 392/467 |
| 3,793,933 A * | 2/1974 | Weber | A47J 31/0573 | 99/302 R |
| 3,869,968 A * | 3/1975 | Ihlenfeld | A47J 31/0573 | 99/280 |
| 3,987,717 A * | 10/1976 | Bergmann | A47J 31/542 | 219/442 |
| 3,996,846 A * | 12/1976 | Hupf | A47J 31/0576 | 99/310 |
| D243,499 S * | 3/1977 | Julkenbeck | D7/309 | |
| D243,737 S * | 3/1977 | Painter | D7/309 | |
| 4,070,956 A * | 1/1978 | Brown | A47J 31/4478 | 392/467 |
| 4,081,659 A * | 3/1978 | Kemp | A47J 31/44 | 439/456 |
| 4,141,286 A * | 2/1979 | Smit | A47J 31/0573 | 392/467 |
| 4,165,681 A * | 8/1979 | Belinkoff | A47J 31/106 | 392/445 |
| D253,866 S * | 1/1980 | Bois | D7/309 | |
| 4,208,957 A * | 6/1980 | Bollman | H05B 1/0269 | 99/283 |
| D283,969 S * | 5/1986 | Sastre | D7/310 | |
| 4,634,838 A * | 1/1987 | Berz | A47J 31/0576 | 392/458 |
| 4,662,271 A * | 5/1987 | Woltermann | A47J 31/402 | 99/295 |
| 4,773,313 A * | 9/1988 | Anson | A47J 31/002 | 99/290 |
| 4,811,657 A * | 3/1989 | Rixen | A47J 31/061 | 99/295 |
| 4,995,311 A * | 2/1991 | Naya | A47J 31/4467 | 99/295 |
| 5,027,696 A * | 7/1991 | Antonini | A47J 31/20 | 99/279 |
| 5,113,751 A * | 5/1992 | Holcomb | A47J 31/4439 | 206/818 |
| 5,115,730 A * | 5/1992 | Gockelmann | A47J 31/0573 | 99/305 |
| 5,168,794 A * | 12/1992 | Glucksman | A47J 31/465 | 99/305 |
| 5,200,221 A * | 4/1993 | Knepler | A47J 31/057 | 426/433 |
| 5,267,506 A * | 12/1993 | Cai | A47J 31/30 | 99/302 R |
| 5,485,778 A * | 1/1996 | Ullmann | A47J 31/446 | 99/295 |
| 5,901,635 A * | 5/1999 | Lucas | A47J 31/56 | 99/305 |
| RE37,173 E * | 5/2001 | Jefferson, Jr. | A47J 31/0621 | 99/302 R |
| 6,279,458 B1 * | 8/2001 | Sham | A47J 31/4457 | 99/305 |
| 6,405,637 B1 * | 6/2002 | Cai | A47J 31/469 | 99/305 |
| 6,729,226 B2 * | 5/2004 | Mangiapane | A47J 31/057 | 99/289 P |
| 7,024,983 B2 * | 4/2006 | Grant | A47J 31/3676 | 99/289 R |
| 7,503,254 B2 * | 3/2009 | Noordhuis | A47J 31/4496 | 99/302 R |
| 9,259,116 B2 * | 2/2016 | Hiron | A47J 31/4464 | |
| 9,320,386 B2 * | 4/2016 | Hulett | A47J 31/4475 | |
| D1,007,216 S * | 12/2023 | Han | D7/309 | |
| 2003/0051604 A1 * | 3/2003 | Torigai | A23F 5/267 | 99/279 |
| 2005/0132892 A1 * | 6/2005 | Hall | A47J 31/047 | 99/279 |
| 2010/0239734 A1 * | 9/2010 | Yoakim | A47J 31/22 | 99/302 C |
| 2012/0025761 A1 * | 2/2012 | Takada | B60L 53/122 | 320/108 |
| 2013/0059049 A1 * | 3/2013 | Zhang | A47J 31/4425 | 99/290 |
| 2013/0214744 A1 * | 8/2013 | Kang | H02J 50/10 | 320/162 |
| 2014/0165845 A1 * | 6/2014 | Issar | A47J 31/401 | 99/287 |
| 2014/0266021 A1 * | 9/2014 | Paladeni | H02J 50/90 | 320/108 |
| 2014/0312026 A1 * | 10/2014 | Trench Roca | A47J 36/165 | 99/348 |
| 2015/0351581 A1 * | 12/2015 | Li | A23F 5/26 | 700/275 |
| 2016/0064984 A1 * | 3/2016 | Suda | H02J 7/0063 | 307/140 |
| 2019/0152323 A1 * | 5/2019 | Moriya | B60L 53/38 | |
| 2021/0143684 A1 * | 5/2021 | Sumiya | H02J 50/90 | |

\* cited by examiner

COFFEE MACHINE FOR WIRELESSLY DRIVING COFFEE CUP HOLDER TO ROTATE

TECHNICAL FIELD

The present disclosure relates to a coffee brewing device, in particular to a coffee machine for wirelessly driving a coffee cup holder to rotate.

BACKGROUND

At present, the existing coffee appliances and water outlet methods in the market all use a direct-flow or spray-type water outlet for brewing coffee, which will seriously affect the brewing effect of coffee. Moreover, professional coffee is made by manual operation, which requires very high skills and is easily limited by the pursuit of consumers.

SUMMARY

The purpose of the present disclosure is to provide a coffee machine for wirelessly driving a coffee cup holder to rotate, which is convenient to use with an independent cup base structure and is capable of wirelessly driving a coffee filter cup to rotate, and has a rotatable coffee cup holder structure without electrical connection.

The purpose of the present disclosure can be realized as follows. A coffee machine for wirelessly driving a coffee cup holder to rotate is designed, a coffee machine for wirelessly driving a coffee cup holder to rotate, comprising a machine body and a cup base; the machine body is separated from the cup base; the cup base comprises a base, a cup holder, a driving motor and a motor driving circuit, wherein the base is internally provided with a driving motor, and the output shaft of the driving motor is sleeved with the cup holder; the upper part of the machine body is provided with a support, the support is provided with a sprinkler head, the sprinkler head is provided above the cup holder, and the height difference between the sprinkler head and the cup holder is capable of accommodating a coffee cup in which a coffee filter cup is placed; the machine body is provided with a first control circuit and a charging coil, the first control circuit controls the charging coil to be powered on, and the charging coil is installed on the side close to the cup base; the cup base is provided with a power receiving coil, the installation position of the power receiving coil corresponds to that of the charging coil, and the output end of the power receiving coil is connected with the motor driving circuit;

a coffee filter cup is placed on the coffee cup, the coffee cup is placed on the cup holder, and the sprinkler head is located above the coffee filter cup; the motor driving circuit controls the operation of the motor to drive the cup holder to rotate and drive the coffee cup and the coffee filter cup on the coffee cup to rotate, and the coffee liquid in the coffee filter cup after spraying is naturally filtered out into the coffee cup by gravity.

Further, a coffee cup detector is provided on the side wall of the machine body close to the cup base, and the detection position of the coffee cup detector is the upper position of the coffee cup.

Further, a coffee filter cup detector is provided on the support, the detection position of the coffee filter cup detector is the upper edge position of the coffee filter cup.

Still further, the detector is an infrared transmitting and receiving diode assembly.

Further, the base is rectangular or circular and located at the bottom, the side of the base close to the machine body is provided with a first aligning magnet, the bottom of the machine body is provided with a second aligning magnet at the position corresponding to the first aligning magnet on the base, and the second aligning magnet and the first aligning magnet adhere the cup base to the machine body for fixing.

Further, a second control circuit is provided in the cup base, the second control circuit wirelessly exchanges data with the first control circuit; a vertical plate is provided on the side of the base close to the machine body, and the power receiving coil is provided in the vertical plate; a coffee cup detector is provided on the side of the vertical plate close to the cup holder, and the coffee cup detector is connected with the second control circuit.

Further, the machine body is provided with a water tank, a heater and a water pump are provided below or outside the bottom of the water tank, a heating element and a temperature sensor are provided in the heater, a heater water outlet of the heater is connected with a water pump inlet of a water pump through a first water pipe, the heater water inlet of the heater is connected with the water inlet device, and a water outlet switch at the bottom of the water tank is connected with the water inlet device at the bottom of the machine body.

Further, a fixing base is provided on the side wall of the upper part of the machine body, a sprinkler head is provided on the fixing base, a water spray nozzle is provided at the bottom of the sprinkler head, the fixing base is of hollow structure, one end of the fixing base is fixedly connected with the side wall of the upper part of the machine body, the sprinkler head has a structure with one end open and the other end closed, and the open end of the sprinkler head rotatably connects the sprinkler head with the free end of the fixing base through a fixing ring.

Further, a water outlet of the water pump is connected with one end of a second water pipe, and the other end of the second water pipe is hermetically connected with the water inlet of the sprinkler head through the fixing base.

Further, a control panel is provided on the upper surface of the machine body, a display screen, a knob and a function key are provided on the control panel, and the display screen, the knob, the function key, the water pump, the heating element and the temperature sensor are connected with the first control circuit.

According to the present disclosure, the charging coil fixed in the machine body and the power receiving coil fixed on the cup base realize wireless connection between the machine body and the cup base. Power is supplied to the cup base through the machine body, so that the motor on the cup base is controlled to drive the annular bracket to rotate. Water is sprayed on the coffee powder on the coffee filter cup at a proper position through the sprinkler head above the coffee filter cup, thereby realizing the effect of artificial coffee brewing and realizing the taste required by consumers for coffee brewing. Therefore, the present disclosure has the advantages of convenient operation, professionalism, low production and manufacturing cost, good effect, strong reliability and the like. The coffee machine can automatically detect and judge the positions of the coffee cup and the coffee filter cup, so as to ensure that coffee will not work without the coffee cup or the coffee filter cup when making coffee, and has the advantage of preventing mis-operation when brewing coffee.

DETAILED DESCRIPTION

The present disclosure will be further described with reference to the following embodiments.

Figure 1:
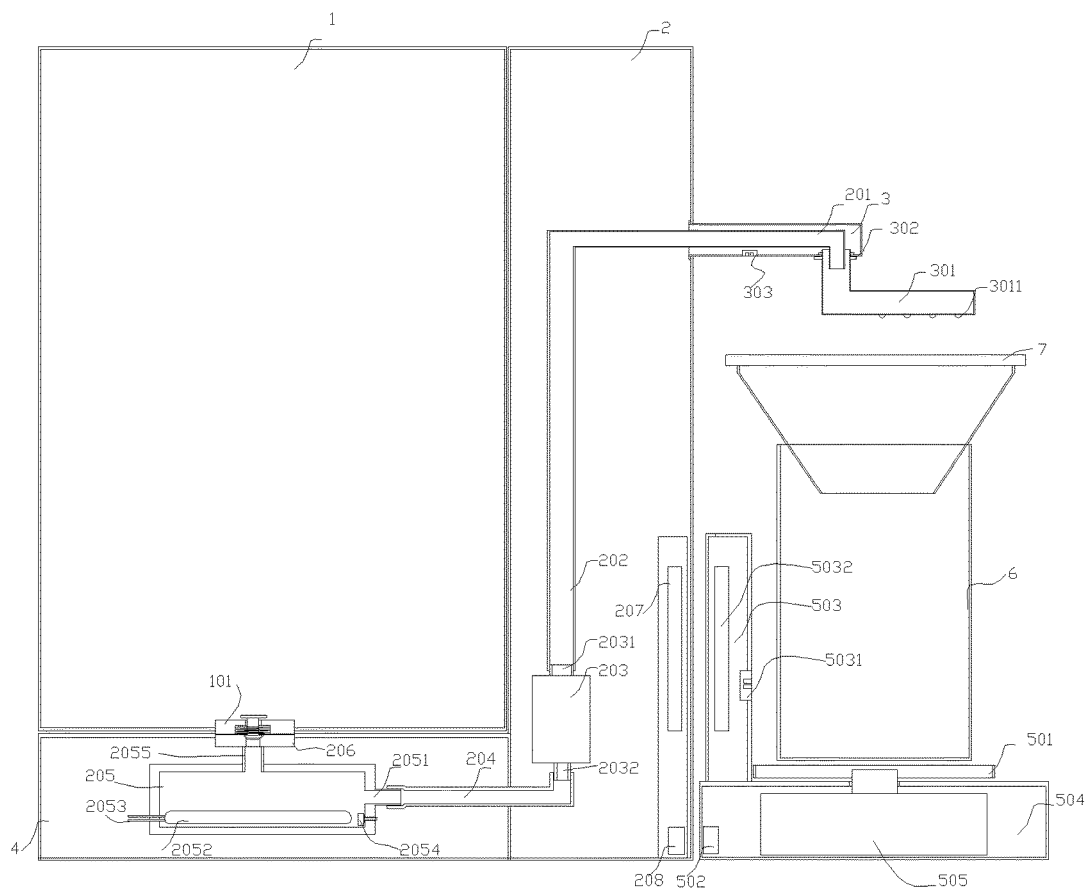
FIG. 1 is a schematic diagram of an embodiment of the present disclosure.
Figure 2:
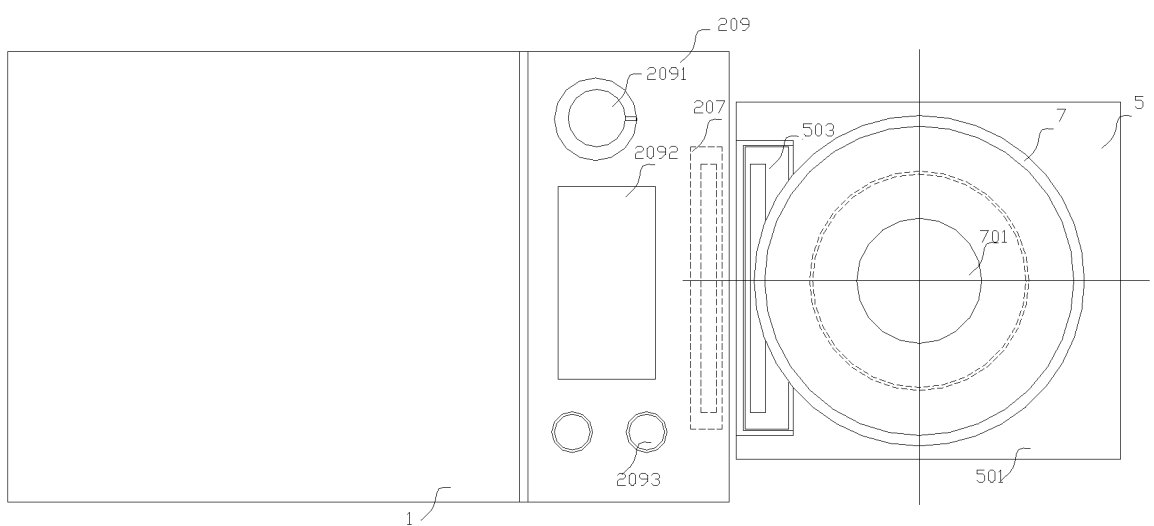
FIG. 2 is a top view of an embodiment of the present disclosure.

As shown in FIG. 1 and FIG. 2, a coffee machine for wirelessly driving a coffee cup holder to rotate comprises a machine body 2 and a cup base 5. The machine body 2 is separated from the cup base 5. The cup base 5 comprises a base 504, a cup holder 501, a driving motor 505 and a motor driving circuit. The driving motor 505 is installed in the base 504. The output shaft of the driving motor 505 is sleeved with the cup holder 501. A coffee cup 6 is placed on the cup holder 501 and a coffee filter cup 7 is placed on the coffee cup 6. The upper part of the machine body 2 is provided with a support 3, and the support 3 is provided with a sprinkler head 301. The sprinkler head 301 is provided above the cup holder 501. The height difference between the sprinkler head 301 and the cup holder 501 is capable of accommodating a coffee cup 6 in which a coffee filter cup 7 is placed. The position of the sprinkler head 301 corresponds to that of the coffee filter cup 7 and is located above the coffee filter cup 7. The machine body 2 is provided with a first control circuit and a charging coil 207. The first control circuit controls the charging coil 207 to be powered on. The charging coil 207 is installed on the side close to the cup base 5. The cup base 5 is provided with a power receiving coil 5032. The position of the power receiving coil 5032 corresponds to that of the charging coil 207, and the output end of the power receiving coil 5032 is connected with the motor driving circuit. The motor driving circuit controls the operation of the motor 505 to drive the cup holder 501 to rotate and drive the coffee cup 6 and the coffee filter cup 7 to rotate. The boiled water is sprayed onto the coffee filter cup 7 by the sprinkler head 301, and the coffee liquid in the coffee filter cup 7 after spraying is naturally filtered out into the coffee cup 6 by gravity. A second control circuit is provided in the cup base 5. The second control circuit wirelessly exchanges data with the first control circuit. A vertical plate 503 is provided on the side of the base 504 close to the machine body 2. The power receiving coil 5032 is provided in the vertical plate 503. The output end of the power receiving coil 5032 is connected with the power supply end of the second control circuit, and the control output end of the second control circuit is connected with the control input end of the motor driving circuit.

A coffee cup detector 5031 is provided on the side of the vertical plate 503 close to the cup holder 501. The detection position of the coffee cup detector 5031 is the lower position of the coffee cup 6. The coffee cup detector 5031 is connected with the second control circuit. The coffee cup detector 5031 can also be installed at other positions. For example, the right side wall of the machine body 2 is provided with the coffee cup detector 5031. The detection position of the coffee cup detector 5031 is the upper position of the coffee cup 6, and the coffee cup detector 5031 is connected with the first control circuit. In this embodiment, the coffee cup detector 5031 is an infrared transmitting and receiving diode assembly.

A coffee filter cup detector 303 is provided on the support 3. The detection position of the coffee filter cup detector 303 is the upper edge position of the coffee filter cup 7. The coffee filter cup detector 303 is connected with the first control circuit. In this embodiment, the coffee filter cup detector 303 is an infrared transmitting and receiving diode assembly.

The machine body 2 is provided with a water tank 1. A heater 205 and a water pump 203 are provided below or outside the bottom of the water tank 1. A heating element 2052 and a temperature sensor 2054 are provided in the heater 205. A heater water outlet 2051 of the heater 205 is connected with a water pump inlet 2032 of a water pump 203 through a first water pipe 204. The heater water inlet 2055 of the heater 205 is connected with the water inlet device 206, and a water outlet switch 101 at the bottom of the water tank is connected with the water inlet device 206 at the bottom of the machine body 2. The heating element 2052, the water pump 203 and the temperature sensor 2054 are connected with the first control circuit.

A support 3 is provided on the side wall of the upper part of the machine body 2. A sprinkler head 301 is provided on the support 3. A water spray nozzle 3011 is provided at the bottom of the sprinkler head 301. The support 3 is of hollow structure. One end of the support 3 is fixedly connected with the side wall of the upper part of the machine body 2. The sprinkler head 301 has a structure with one end open and the other end closed. The water spray nozzle 3011 is located above the coffee filter cup 7. The water spray nozzle 3011 sprays boiled water on the coffee powder in the coffee filter cup 7, and the coffee liquid in the coffee filter cup 7 is naturally filtered out into the coffee cup 6 by gravity. The open end of the sprinkler head 301 rotatably connects the sprinkler head 301 with the free end of the support 3 through a fixed ring 302. The water outlet 2031 of the water pump 203 is connected with one end of a second water pipe 202, and the other end of the second water pipe 202 is hermetically connected with the water inlet of the sprinkler head 301 through the support 3.

The upper part of the machine body 2 is provided with a first control circuit. A control panel 209 is provided on the upper surface of the machine body 2. A display screen 2092, a knob 2091 and a function key 2093 are provided on the control panel 209. The user selects corresponding functions through the knob 2091 and the function key 2093 of the control panel 209, and displays the selected functions and other information on the display screen 2092. The display screen 2092, the knob 2091 and the function key 2093 are connected with the first control circuit.

The cup base 5 is provided with a second control circuit and a motor driving circuit. The control input end of the motor driving circuit is connected with the control output end of the second control circuit, and the power supply end of the second control circuit is connected with the power receiving coil 5032. The cup base 5 comprises a base 504, a cup holder 501 and a driving motor 505. The base 504 is rectangular or circular and is located at the bottom. The side of the base close to the machine body 2 is provided with a first aligning magnet 502. The bottom of the machine body 2 is provided with a second aligning magnet 208 at the position corresponding to the first aligning magnet 502 on the base 504, and the second aligning magnet 208 and the first aligning magnet 502 adhere the cup base 5 to the machine body 2 for fixing. The driving motor 505 is connected with the output end of the motor driving circuit. The rotation of the driving motor 505 is realized by controlling the motor driving circuit through a second control circuit. The second control circuit is connected with the first control circuit through wireless signals, such as Bluetooth, WIFI, etc. The second control circuit and the first control circuit are commonly used control circuits.

The following is the use process of the present disclosure:

The coffee machine for wirelessly driving a coffee cup holder to rotate is powered, a proper amount of water is added into the water tank 1, the coffee cup 6 is placed into the coffee cup holder 501 on the cup base 5, then the coffee filter cup 7 is placed on the coffee cup 6, a proper amount of coffee powder is added in the coffee filter cup 7, the "simulated artificial brewing" function key 2093 on the control panel 209 is selected, and the sprinkler head 301 is manually adjusted to a position where the coffee powder on the inclined wall of the coffee filter cup 7 can be covered. "ON" button on the control panel 209 is activated. At this time, the first control circuit in the machine body 2 controls the charging coil 207 under the machine body 2 to power on, and the power receiving coil 5032 on the cup base 5 corresponding to the charging coil 207 obtains induced voltage. The induced voltage supplies power to the second control circuit on the cup base 5. The coffee cup detector 5031 on the vertical plate 503 starts to work. The coffee cup detector 5031 detects that the coffee cup 6 has been placed on the coffee cup holder 501 on the cup base 5. The first control circuit receives the signal that "the coffee cup 6 has been placed" on the second control circuit. At the same time, the coffee filter cup detector 303 on the support 3 detects the coffee filter cup 7 placed on the coffee cup 6, and the first control circuit receives the signal of the coffee filter cup detector 303 that "the coffee filter cup 7 has been placed". At this time, the water in the water tank 1 enters the heater 205. The first control circuit controls the heating element 2052 in the heater 205 to heat (if it is not detected that there is a coffee cup 6 on the coffee cup holder 501 on the cup base 5 and a coffee filter cup 7 is placed on the coffee cup 6, the heater 205 at the bottom of the machine body 2 does not heat). A temperature sensor 2054 in the heater 205 starts to detect the water temperature. When the temperature sensor 2054 in the heater 205 detects that the water temperature is above 98 degrees, the first control circuit sends a control signal controlling the motor 505 to rotate to the second control circuit through Bluetooth. The second control circuit receives the signal from the first control circuit to control the rotation of the motor 505. The second control circuit controls the motor driving circuit to drive the motor 505 to rotate. The cup holder 501 rotates with the coffee cup 6 driven by the driving motor 505, and the coffee filter cup 7 on the coffee cup 6 also rotates. The first control circuit controls the water pump 203 to start working, pumping boiled water to the water outlet pipe 2051 and entering the first water pipe 204. After passing through the water pump 203, boiled water enters the second water pipe 202 through the water outlet pipe 2031, and then passes through the support 3, pumping boiled water to the sprinkler head 301. Boiled water is sprayed from the water spray nozzle 3011 below the water spray head 301 on the coffee powder on the coffee filter cup 7. At the same time, the rotation of the cup holder 501 rotates the coffee cup 6, and the rotation of the coffee cup 6 rotates the coffee filter cup 7. Although the water spray nozzle 3011 does not rotate due to the rotation of the coffee filter cup 7, the boiled water sprayed by the water spray nozzle 301 can be uniformly sprayed on the coffee powder on the coffee filter cup 7 due to the rotation of the coffee filter cup 7. In this way, the effect of "simulating artificial brewing" of coffee is realized, and the brewed coffee has better taste.

According to the present disclosure, the phenomenon can be avoided that the solidification of coffee powder production caused by manual operation affects the brewing effect and the demand of consumers cannot be met. The present disclosure has the advantages of convenient and professional operation, safe use, low cost, strong reliability and the like.

What is claimed is:

1. A coffee machine for wirelessly controlling a coffee cup holder to rotate, comprising a machine body and a cup base; the machine body is separated from the cup base; the cup base comprises a base, a cup holder and a driving motor, wherein the base is internally provided with the driving motor, and an output shaft of the driving motor is sleeved with the cup holder; an upper part of the machine body is provided with a support, the support is provided with a sprinkler head, the sprinkler head is provided above the cup holder, and a height difference between the sprinkler head and the cup holder is capable of accommodating a coffee cup in which a coffee filter cup is placed; the machine body is provided with a charging coil, the charging coil is installed on a side of the machine body close to the cup base; the cup base is provided with a power receiving coil, an installation position of the power receiving coil corresponds to that of the charging coil;

the coffee filter cup is placed on the coffee cup, the coffee cup is placed on the cup holder, and the sprinkler head is located above the coffee filter cup; the motor driving the cup holder to rotate and driving the coffee cup and the coffee filter cup on the coffee cup to rotate, and a coffee liquid in the coffee filter cup after spraying is naturally filtered out into the coffee cup by gravity.

2. The coffee machine for wirelessly controlling the cup holder to rotate according to claim 1, wherein a coffee cup detector is provided on a side wall of the machine body close to the cup base, a detection position of the coffee cup detector is an upper position of the coffee cup.

3. The coffee machine for wirelessly controlling the cup holder to rotate according to claim 1, wherein a coffee filter cup detector is provided on the support, a detection position of the coffee filter cup detector is an upper edge position of the coffee filter cup.

4. The coffee machine for wirelessly controlling the cup holder to rotate according to claim 2, wherein the detector is an infrared transmitting and receiving diode assembly.

5. The coffee machine for wirelessly controlling the cup holder to rotate according to claim 3, wherein the detector is an infrared transmitting and receiving diode assembly.

6. The coffee machine for wirelessly controlling the holder to rotate according to claim 1, wherein the base is rectangular or circular and located at the bottom, a side of the base close to the machine body is provided with a first aligning magnet, a bottom of the machine body is provided with a second aligning magnet at the position corresponding to the first aligning magnet on the base, and the second aligning magnet and the first aligning magnet adhere the cup base to the machine body for fixing.

7. The coffee machine for wirelessly controlling the cup holder to rotate according to claim 1, wherein a vertical plate is provided on a side of the base close to the machine body, and the power receiving coil is provided in the vertical plate; a coffee cup detector is provided on a side of the vertical plate close to the cup holder, a detection position of the coffee cup detector is a lower position of the coffee cup.

8. The coffee machine for wirelessly controlling the cup holder to rotate according to claim 1, wherein the machine body is provided with a water tank, a heater and a water pump are provided below or outside a bottom of the water tank, a heating element and a temperature sensor are provided in the heater, a heater water outlet of the heater is connected with a water pump inlet of the water pump through a first water pipe, a heater water inlet of the heater is connected with a water inlet device, and a water outlet switch at the bottom of the water tank is connected with the water inlet device at a bottom of the machine body.

9. The coffee machine for wirelessly controlling the cup holder to rotate according to claim 1, wherein the support is provided on a side wall of the upper part of the machine body, a water spray nozzle is provided at a bottom of the sprinkler head, the support is of hollow structure, one end of the support is fixedly connected with the side wall of the upper part of the machine body, the sprinkler head has a structure with one end open and the other end closed, and the open end of the sprinkler head rotatably connects the sprinkler head with a free end of the support through a fixed ring.

10. The coffee machine for wirelessly controlling the cup holder to rotate according to claim 8, wherein a water outlet of the water pump is connected with one end of a second water pipe, and the other end of the second water pipe is hermetically connected with a water inlet of the sprinkler head through the support.

11. The coffee machine for wirelessly controlling the cup holder to rotate according to claim 8 wherein a control panel is provided on an upper surface of the machine body, a display screen, a knob and a function key are provided on the control panel, and the display screen, the knob, the function key, the water pump, the heating element and the temperature sensor are electrically connected.

* * * * *